(12) United States Patent
Ruffieux et al.

(10) Patent No.: US 11,012,067 B2
(45) Date of Patent: May 18, 2021

(54) COMPENSATION DEVICE FOR COMPENSATING PVT VARIATIONS OF AN ANALOG AND/OR DIGITAL CIRCUIT

(71) Applicant: CSEM Centre Suisse d'Electronique et de Microtechnique SA—Recherche et Developpement, Neuchatel (CH)

(72) Inventors: David Ruffieux, Les Agettes (CH); Camilo Andres Salazar Gutierrez, Neuchatel (CH); Marc Pons Sole, Neuchatel (CH); Daniel Severac, Yverdon-les-Bains (CH); Jean-Luc Nagel, Chambrelien (CH); Alain-Serge Porret, Neuchatel (CH)

(73) Assignee: CSEM CENTRE SUISSE D'ELECTRONIQUE ET DE MICROTECHNIQUE SA—RECHERCHE ET DÉVELOPPEMENT, Neuchâtel (CH)

( * ) Notice: Subject to any disclaimer, the term of this patent is extended or adjusted under 35 U.S.C. 154(b) by 0 days.

(21) Appl. No.: 16/319,369

(22) PCT Filed: Jul. 22, 2016

(86) PCT No.: PCT/IB2016/054383
§ 371 (c)(1),
(2) Date: Jan. 21, 2019

(87) PCT Pub. No.: WO2018/015791
PCT Pub. Date: Jan. 25, 2018

(65) Prior Publication Data
US 2019/0280688 A1    Sep. 12, 2019

(51) Int. Cl.
*H03K 17/14* (2006.01)
*H03K 3/011* (2006.01)
*H03K 19/003* (2006.01)

(52) U.S. Cl.
CPC ........... *H03K 17/145* (2013.01); *H03K 3/011* (2013.01); *H03K 19/00384* (2013.01)

(58) Field of Classification Search
CPC ..... H01L 22/00; H01L 22/34; H01L 2924/00; H01L 2924/3011; H03F 3/00; H03F 3/72;
(Continued)

(56) References Cited

U.S. PATENT DOCUMENTS

| 9,762,245 B1* | 9/2017 | Otto ................. H03K 19/09487 |
| 2002/0079951 A1* | 6/2002 | Borkar ............... H03K 19/0948 327/534 |

(Continued)

FOREIGN PATENT DOCUMENTS

| DE | 69408320 T2 | 8/1998 |
| EP | 2120124 A1 | 11/2009 |

(Continued)

OTHER PUBLICATIONS

G. Ono and M. Miyazaki, "Threshold-voltage balance for minimum supply operation [LV CMOS chips]," in IEEE Journal of Solid-State Circuits, vol. 38, No. 5, pp. 830-833, May 2003, doi: 10.1109/JSSC.2003.810043. (Year: 2003).*

(Continued)

*Primary Examiner* — Lincoln D Donovan
*Assistant Examiner* — Dave Mattison
(74) *Attorney, Agent, or Firm* — Pearne & Gordon LLP

(57) ABSTRACT

A compensation device for compensating PVT variations of an analog and/or digital circuit. The compensation device includes a transistor having a first terminal, a second terminal, a third terminal, and a fourth terminal allowing to modify a threshold voltage of the transistor. The transistor is configured to be in saturation region. The voltage at the third terminal has a predetermined value and the difference between the voltage at the second terminal and the voltage (Continued)

at the third terminal has a predetermined value. A current generation module is configured to generate a current of a predetermined value. A compensation module is configured to force this current to flow between the first terminal and the third terminal by adjusting the voltage of the fourth terminal.

24 Claims, 3 Drawing Sheets

(58) Field of Classification Search
CPC ...... H03K 17/00; H03K 17/145; H03K 19/00; H03K 19/00384; H03K 3/00; H03K 3/011
USPC .......................................................... 327/378
See application file for complete search history.

(56) References Cited

U.S. PATENT DOCUMENTS

| | | | |
|---|---|---|---|
| 2004/0135621 A1* | 7/2004 | Sumita | ................... G05F 3/205 327/534 |
| 2005/0162212 A1 | 7/2005 | Sakiyama et al. | |
| 2008/0072181 A1 | 3/2008 | Baumgartner et al. | |
| 2009/0167420 A1 | 7/2009 | Nowak | |
| 2010/0164607 A1 | 7/2010 | Miyatake et al. | |
| 2011/0215862 A1* | 9/2011 | La Rosa | ................... G05F 3/24 327/541 |
| 2016/0118984 A1* | 4/2016 | Chern | ..................... G11C 7/10 365/189.02 |
| 2019/0101946 A1* | 4/2019 | Herberholz | ......... H01L 27/0222 |

FOREIGN PATENT DOCUMENTS

| | | |
|---|---|---|
| JP | H08-508600 A | 9/1996 |
| JP | 2004-165649 A | 6/2004 |
| JP | 2005-536105 A | 11/2005 |
| JP | 2011-055459 A | 3/2011 |
| JP | 2011-096950 A | 5/2011 |
| JP | 2014-106085 A | 6/2014 |
| JP | 2015-188214 A | 10/2015 |
| WO | 9423353 A1 | 10/1994 |
| WO | 2004015867 A1 | 2/2004 |
| WO | 2004/077673 A1 | 9/2004 |

OTHER PUBLICATIONS

International Search Report for PCT/IB2016/054383 dated Apr. 13, 2017.
Written Opinion for PCT/IB2016/054383 dated Apr. 13, 2017.
Translation of Office Action for corresponding Japanese patent application No. 2019-503345 dated Aug. 5, 2020.

\* cited by examiner

COMPENSATION DEVICE FOR COMPENSATING PVT VARIATIONS OF AN ANALOG AND/OR DIGITAL CIRCUIT

FIELD OF THE INVENTION

The present invention concerns a compensation device for compensating PVT variations of an analog and/or digital circuit. In particular, the present invention concerns a compensation device allowing to adaptively and dynamically control the current of at least one transistor of an digital and/or analog circuit to be compensated, working at a given supply voltage, preferably in the sub- or near-threshold region.

DESCRIPTION OF RELATED ART

With the constant scaling of MOS transistors resulting in ever increasing speed performance, it has long been proposed to supply analog and/or digital circuits (e.g. and in a non-limiting way, digital gates) at lower voltages, so to spare dynamic power (equal to $f \cdot C \cdot V^2$, where f is the clock frequency, C the gate capacitance being switched and V the supply voltage of the circuit), as long as required speed performance can be met.

Provided the transistors are operated in strong inversion or in the super-$V_{Th}$ region (i.e. their gate-source voltage is higher than the threshold voltage of the transistor, i.e. $|V_{GS}| \gg V_{Th}$), the variation in speed performance of the analog and/or digital circuit over Process-Voltage-Temperature variations ("PVT variations" in the following) remains reasonable, permitting the generation of the lower reference voltage, e.g. by using a bandgap circuit or a similar circuit, providing a mostly PVT-insensitive constant voltage output. In such a way, it is possible to guarantee a controlled dynamic power dissipation.

For example, a 180 nm CMOS node having a nominal core voltage $V_{DD}$ of 1.8 V, a threshold voltage $V_{Th}$ of 450 mV, operation at $V_{DD}$ from 0.8 V to 1 V permits an about 4-fold power reduction.

However, more advanced process nodes face a constant nominal voltage reduction (e.g. 1 V-1.2 V for a 55-65 nm CMOS) imposed by thinner gate oxide, calling for more drastic voltage reduction if significant energy savings are desired. As the threshold voltage $V_{Th}$ of the transistors does not scale as fast as nominal voltage, the transistors of the analog and/or digital circuits are operated more and more in the near-threshold region or in the sub-threshold region, exacerbating their sensitivity to PVT variations.

In this context, the expression "sub-threshold region" indicates that the gate-source voltage of the transistor is lower than the threshold voltage of the transistor, i.e. $|V_{GS}| < V_{Th}$.

In this context, the expression "near-threshold region" indicates that the gate-source voltage of the transistor is at or near the threshold voltage of the transistor, i.e. $|V_{GS}| \cong V_{Th}$. In other words, the difference between the gate-source voltage of the transistor and its threshold voltage is of some tenths of Volts at most.

In near-threshold regions or in a sub-threshold regions, the bandgap-based constant voltage approach, used in super-$V_{Th}$ regions, reaches its limits, calling for PVT-variations tracking adaptive reference generation devices.

Ways to control the power dissipation of logic gates were proposed for watch circuits, for a nominal voltage $V_{DD}$ of 5 V and for threshold voltage $V_{Th}$ of about 2 V. An example is illustrated in FIG. 1. It is described in the document E. Vittoz et. al., "High-Performance Crystal Oscillator Circuits: Theory and Application", IEEE, J. Solid State Circuits, Vol. 23, no. 3, pp. 774-783, June 1998. In this case an adaptive reference voltage VREF1 is built by feeding two diode connected N and PMOS transistors stacked in series with a given current I. The generated reference voltage VREF1 corresponds to the sum of the threshold voltage $V_{th}$ of the NMOS transistor $T_N$, of the threshold voltage $V_{th}$ of the PMOS transistor $T_P$ plus a term depending on their MOS inversion coefficient. Digital circuits as logic gates comprising transistors of the same technology of the transistors $T_N$ and $T_P$ and powered by the output of a unity gain buffer 10 (VREG1=VREF1) will hence be crossed by a similar current at their switching point (corresponding to a gate to source voltage of about ½ VREF), somewhat controlling the transitions speed.

The main drawback of the compensation device illustrated in FIG. 1 is the large variability of the reference voltage VREF1 over PVT variations that can exceed 800 mV, as both contributions of NMOS and PMOS threshold voltage variations add up. As a consequence, the dynamic power dissipated by the logic gates compensated by such a device will vary significantly. Moreover, a DCDC based powering scheme more efficient than a Low-DropOut regulator ("LDO"), where the energy between the $V_{DD}$ and VREG1 headroom is merely dissipated, is not so attractive and easy to implement. Moreover, unless the biasing current I is made extremely small, VREF1 will be rather large, leading to a super-$V_{Th}$ regime for the logic gates far from optimum regarding power dissipation, if speed requirements are moderate or low.

FIG. 2 shows a schematic view of another known compensation device, generating a lower voltage. It is described in the document S. Z Asl, et. al., "A 3 ppm 1.5×0.8 $mm^2$ 1.0 µA 32.768 kHz MEMS-Based Oscillator", J. Solid-State Circuits, Vol. 50, no. 1, pp. 1-12, January 2015. The gates of the two N and PMOS reference transistors $T_N$ respectively $T_P$, rather than being short circuited together at a voltage of about ½ VREF, are connected to the opposite rails, VREF2 and ground, in a nested diode configuration. If a current I similar to the current used in the compensation device of FIG. 1 is used, the reference voltage VREF2 is almost halved with regard to VREF1, since the reference voltage VREF2 consists of the maximum between the threshold voltage of $T_N$ and the of the threshold voltage of $T_P$, plus a term depending on the MOS inversion coefficient.

The advantage of the compensation device illustrated in FIG. 2 with regard to the compensation device illustrated in FIG. 1 is that the variations of its reference voltage VREF2 resulting from PVT ones are halved compared to compensation device of FIG. 1. However, they still represent up to 400 mV. Therefore, logic gates comprising transistors of the same technology of the transistors $T_N$ and $T_P$, powered at voltage level VREG2 and compensated by such a device will have their slowest transistor (NMOS or PMOS) delivering an ION current similar to the biasing one I, guarantying a minimum circuit speed. The speed of the other transistor type (PMOS or NOMOS) will depend on the specific process corner, being maximal in slow-fast (SF) or fast-low (FS) cases, and rather close in typical-typical (TT), fast-fast (FF) or slow-slow (SS) ones. Under low voltage operation, in the case the transistors are operated in the sub- or near-threshold region, this can result in huge N to P type MOS current ratios, leading to large leakage currents or even compromising retention in SRAM cells of the circuit to be compensated.

In this context, the expression "low voltage operation" for a circuit indicates that the difference between the voltage of a first supply source and the voltage of a second supply source of the circuit is comprised between 50 mV and 900 mV, preferably being substantially equal to 500 mV.

Therefore, it is an aim of the present invention to propose a compensation device in which the aforementioned disadvantages are obviated or mitigated.

It is an aim of the present invention to propose a compensation device for compensating PVT variations of an analog and/or digital circuit in which the power dissipated in this circuit does not vary significantly.

It is an aim of the present invention to propose a compensation device for compensating PVT variations of an analog and/or digital circuit in which the power dissipation is optimised.

It is an aim of the present invention to propose a compensation device compensating in an efficient way PVT variations of an analog and/or digital circuit operating at low voltages.

It is an aim of the present invention to propose a compensation device compensating in an efficient way PVT variations of an analog and/or digital circuit operating in the sub- or near-threshold region.

It is an aim of the present invention to propose a compensation device devoid of PVT variations monitoring structures.

BRIEF SUMMARY OF THE INVENTION

According to the invention, these aims are achieved by means of a compensation device for compensating PVT variations of an analog and/or digital circuit, the compensation device comprising a transistor comprising:

a first terminal,
a second terminal,
a third terminal, and
a fourth terminal.

In the context of the present invention, the term "terminal" must be considered as a synonym of a node. It does not necessarily indicate that it is a pin that can be physically accessed by a user.

In one embodiment, the first terminal is the drain terminal, the second terminal is a gate terminal and the third terminal is the source terminal of the transistor. According to the invention, the fourth terminal allows to modify a threshold voltage of the transistor. Then, in one embodiment, the fourth terminal is the bulk terminal of the transistor. In another embodiment, in particular if the transistor is realised in the technology silicon on insulator (SIO) or fully depleted silicon on insulator (FDSOI), the fourth terminal is the back gate terminal of the transistor. In another one embodiment in which the transistor comprises two gate terminals, the fourth terminal is one of the two gate terminals.

According to the invention, the transistor is configured to be in saturation region, i.e. in the region in which the current flowing between the first terminal and the third terminal is substantially independent from the voltage between the first terminal and the third terminal. For example, for transistors of N type operating in strong inversion, it means that $V_{DS} > V_{GS} - V_{th}$.

According to the invention, the voltage at the third terminal has a given or predetermined value. In one embodiment, the third terminal is connected to a supply source, so that the voltage at the third terminal is equal to the voltage of the supply source or it is related to this voltage. In other embodiment, the third terminal is connected to means allowing to indirectly or virtually impose to the third terminal this given or predetermined value. For example, the third terminal can be connected to an input terminal of an operational amplifier whose other input terminal is at a given voltage (e.g. it is connected to a supply source): in such a case, the virtual ground of the operational amplifier allows to fix the voltage at the third terminal to the voltage of the supply source.

According to the invention, the difference between the voltage at the second terminal and the voltage at the third terminal is known or has a predetermined value.

The compensation device according to the invention comprises also a current generation module, configured to generate a current of a known or predetermined value, and a compensation module, configured to force this current to flow between the first terminal and the third terminal by adjusting the voltage of the fourth terminal.

In other words, the compensation module is a module configured to impose the current of the current generation module through a transistor and to adaptively alter the voltage at the fourth terminal depending on the PVT variations, so as to compensate the PVT variations.

In fact, once the value of the current is imposed or known, the voltage at the fourth terminal—for a given supply voltage—depends only on some parameters which vary in function of process, temperature and/or voltage variations. By adaptively adjusting the voltage of the fourth terminal depending on the PVT variations, it is possible to compensate at once all the variations, without monitoring in an individual way each of those parameters.

The output of the compensation module, which is connected to the fourth terminal of the transistor, is configured to be connected to the corresponding fourth terminal of a transistor of the analog and/or digital circuit to be compensated, the transistor of the analog and/or digital circuit to be compensated being of the same technology of the transistor of the compensation device.

Then, the compensation device according to the invention allows to impose to the analog and/or digital circuit a current at a given voltage substantially equal to the current from the current generation module. In fact, at a given temporal instant, the fourth terminal of the compensation device allows to impose the current of the current generation module to a transistor of the analog and/or digital circuit to be compensated, the two transistors (i.e. the transistor of the compensation device and the transistor of the circuit to be compensated) having the same voltage difference between the second terminal and the third terminal, and the same voltage difference between the fourth terminal and the third terminal.

Therefore, the compensation device according to the invention allows to control the current flowing in the transistor of the circuit to be compensated, by adjusting its threshold voltage through its fourth terminal. Advantageously, this allows to minimize the supply voltage of the circuit to be compensated, as the voltage headroom present in the known circuits imposed by PVT variations is not anymore necessary.

In fact, according to one embodiment, the analog and/or digital circuit is devoid of voltage headroom.

In other words, the compensation device according to the invention permits to implement low voltage analog and/or digital circuits, and therefore sparing power: it is possible for example to reduce their minimum supply voltage by at least 300 mV in single NMOS or PMOS topology (VTN or VTP structure), or even 600 mV for stacked NMOS and PMOS topologies (VTN+VTP structures).

Advantageously, the compensation device according to the invention allows to reduce or even eliminate the influence of deterministic PVT variations (~100 k fold reduction with regard to known solutions) without necessitating PVT variations monitoring structures. In fact, the compensation device according to the invention automatically and adaptively adjust the voltage at the fourth terminal depending on PVT variations.

Advantageously, the compensation device according to the invention allows to optimize dynamic power dissipation.

If the circuit to be compensated is a digital circuit, the compensation device according to the invention allows to control the speed of both rising and falling edge transitions of the digital circuit, permitting in addition to match rise and fall time.

Advantageously, the compensation device according to the invention allows to control leakage contributions from N and P type transistors.

According to one embodiment, the compensation device comprises a first supply source, and preferably a second supply source different from the first.

According to one embodiment, the current of given or known value generated by the current source module is a function of at least one supply source, preferably of the difference between the two supply sources. This embodiment allows to better control the frequency f of a digital circuit to be compensated if one of the two supply voltages varies, as $f=I/(CV)=1/(RC)$.

According to a first possible embodiment, the compensation module comprises an operational amplifier comprising an inverting input terminal, a non-inverting input terminal and an output terminal, wherein:
the inverting input terminal is connected to the current generation module and to the third terminal of the transistor,
the non-inverting input terminal is connected to the first supply source,
the output terminal is connected to the fourth terminal, and wherein
the second supply source is connected to the first terminal of the transistor.

In the context of the present invention, the expression "connected to" means that the connection can be direct (i.e. without any element between the two connected parts), or that the two connected parts are linked by an electric path comprising in between one or more elements which do not modify the voltage between the connected parts (e.g. a buffer). The expression "connected to" could also mean that the two connected parts are linked by an electric path comprising in between one or more elements which could modify the voltage between the connected parts.

According to a second possible embodiment alternative to the above-mentioned first embodiment, the compensation module comprises an operational amplifier comprising an inverting input terminal, a non-inverting input terminal and an output terminal, wherein:
the non-inverting input terminal is connected to the current generation module and to the first terminal of the transistor,
the inverting input terminal is connected to the first supply source or to a voltage guarantying the saturation of the transistor,
the output terminal is connected to the fourth terminal, and wherein
the second supply source is connected to the third terminal of the transistor.

It must be noted that in the above-mentioned first and second embodiments, the current generation module and an input terminal of the operational amplifier are connected, preferably directly connected. Both are also connected to a terminal of the transistor. If the first terminal of the transistor is used, the input terminal of the operational amplifier is the non-inverting input terminal, independently of the type (N or P) of the transistor. If the third terminal of the transistor is used, the input terminal of the operational amplifier is the inverting input terminal, independently of the type (N or P) of the transistor.

According to a third possible embodiment alternative to the above-mentioned first and second embodiments, the compensation module comprises a comparator followed by a charge pump module and an integrator. In this embodiment, the compensation module is devoid of operational amplifier, as its function is performed by the comparator, the charge pump module and the integrator.

According to an embodiment, the second terminal of the transistor can be connected:
to the first terminal: in this case, the transistor is diode configured ($V_G=V_D$); in this case, it is possible to impose the ION current to a digital circuit to be compensated,
to a node of a fixed voltage, for example to a node having a voltage substantially equal to $V_{DD}/2$: in this case, it is possible to impose the switching current to a digital circuit to be compensated;
or
to the third terminal: in this case, it is possible to control the leakage currents of the digital circuit to be compensated; this is advantageous if the digital circuit comprises memory cells, e.g. SRAM cells.

According to an embodiment, the current generation module comprises:
a current source connected to the first terminal or to the third terminal of the transistor, or
a resistor connected to the first terminal or to the third terminal of the transistor and placed between two nodes of known voltages, the current flowing in the transistor being related to another known current.

The above-mentioned resistor can be implemented either by a physical resistance, a switch cap circuit or an appropriately sized and biased transisto.

According to another embodiment, the current generation module is a variable current generation module, generating a current of a given value that can be selected by a user among different values.

According to another embodiment, the module of the difference between the voltage of first supply source and the voltage of second supply source is comprised between 50 mV and 900 mV, and preferably is substantially equal to 500 mV. Operation at such low voltages allows to spare dynamic power, as the latter scales quadratically with the supply voltage.

According to another embodiment, the transistor is operated to work in a sub-threshold region or in a near-threshold region. One of the challenge of sub-threshold region stems from the exponential law of the transistor (the drain current is exponentially related to $V_{GS}$), which leads to a rapid reduction of the circuit speed as $V_{DD}$ is lowered, increases the relative weight of leakage currents and yields the highest sensitivity to PVT variations. Advantageously, the compensation device according to the invention allows to eliminate all deterministic variations introduced by PVT variations, allowing the use of transistors operated in a sub-threshold region or in a near-threshold region.

According to another embodiment, the compensation device according to the invention comprises a battery, and means for generating the voltages of first and second supply sources from this battery, e.g. at least one LDO and/or at least one DCDC converter.

Instead of comprising a battery, the compensation device according to the invention could comprise a solar cell or a harvesting source, directly generating the difference between the voltages of the first and second supply sources.

In another embodiment, the compensation device according to the invention also comprises means (e.g. and in a non-limiting way, charge pumps) generating voltages higher and/or lower than the voltages of the first and second supply sources for supplying the current generation module and/or the compensation module.

According to another embodiment, the transistor of the compensation device according to the invention is realised in the technology fully depleted silicon on insulator (FD-SOI) or in the technology deeply depleted channel (DDC).

According to another embodiment, the transistor of the compensation device is a first transistor of a N or P type, the current generation module is a first current generation module, the compensation module is a first compensation module, the device further comprising
- a second transistor of P respectively N type, this second transistor comprising
  - a first terminal (drain),
  - a second terminal (gate),
  - a third terminal (source), and
  - a fourth terminal allowing to modify a threshold voltage of the second transisto.

wherein the second transistor is configured to be in saturation region, wherein the voltage at the third terminal (source) of the second transistor has a predetermined value and the difference between the voltage at the second terminal (G) and the voltage at the third terminal of the second transistor (S) has a predetermined,
- a second current generation module, configured to generate a current of a predetermined value, not necessarily equal to the current generated by the first current generation module,
- a second compensation module, configured to force the current generated by the second current generation module to flow between the first terminal and the third terminal of the second transistor by adjusting the voltage of the fourth terminal of the second transistor.

The above-mentioned embodiment allows to control the current—and hence speed or delay of a digital circuit to be compensated—of both type of MOS independently, by adjusting their threshold voltages through their fourth terminals.

The present invention concerns also an electronic device comprising:
- at least one compensation device according to the invention,
- an analog and/or a digital circuit comprising at least one transistor,
- means for connecting an output terminal of the compensation module to the fourth terminal of the transistor of the analog and/or digital circuit, wherein at a given temporal instant, the difference between the voltage at the second terminal and the voltage at the third terminal of the transistor of the compensation device is substantially equal to difference between the voltage at the second terminal and the voltage at the third terminal of the transistor of the analog and/or a digital circuit.
wherein
at the same temporal instant, the difference between the voltage at the fourth terminal and the voltage at the third terminal of the transistor of the compensation device is substantially equal to difference between the voltage at the fourth terminal and the voltage at the third terminal of the transistor of the analog and/or a digital circuit.
and wherein
the transistor of the compensation device is of the same technology of the transistor of the analog and/or digital circuit.

Examples of analog and/or digital circuits to be compensated comprise, but are not limited to, voltage or current references, amplifier, oscillator, memory cells (e.g. SRAM, ROM cells), digital accelerators, processors, etc.

In one embodiment, the electronic device according to the invention comprises two or more compensation devices according to the invention, and the analog and/or a digital circuit comprises at least one switch arranged to connect the fourth terminal of the transistor of the analog and/or digital circuit to one of the two or more output terminals of the compensation modules.

If the analog and/or digital circuit to be compensated comprises a first transistor of a N or P type, and a second transistor of P respectively N type, the electronic device further comprises means for connecting the output terminal of the second compensation module to the fourth terminal of the second transistor of the analog and/or digital circuit.

According to another embodiment, the compensation device according to the invention comprises an oscillator and a switched cap circuit clocked by this oscillator and whose voltage reference is related to the first and second supply voltages so that their ratio remains constant, and a capacitor that matches a capacitor of the circuit to be compensated, so as to compensate the capacitance variation of this capacitor.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENT(S) OF THE INVENTION

Figure 1:
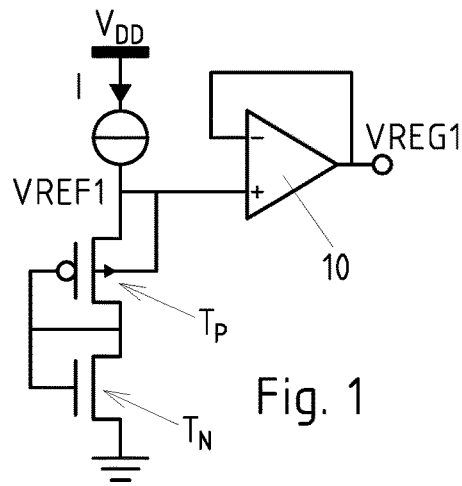
FIG. 1 shows a schematic view of a first known compensation device.
Figure 2:
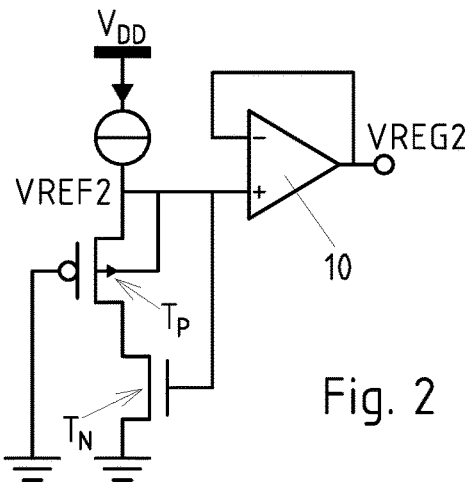
FIG. 2 shows a schematic view of a second known compensation device.
Figure 3:
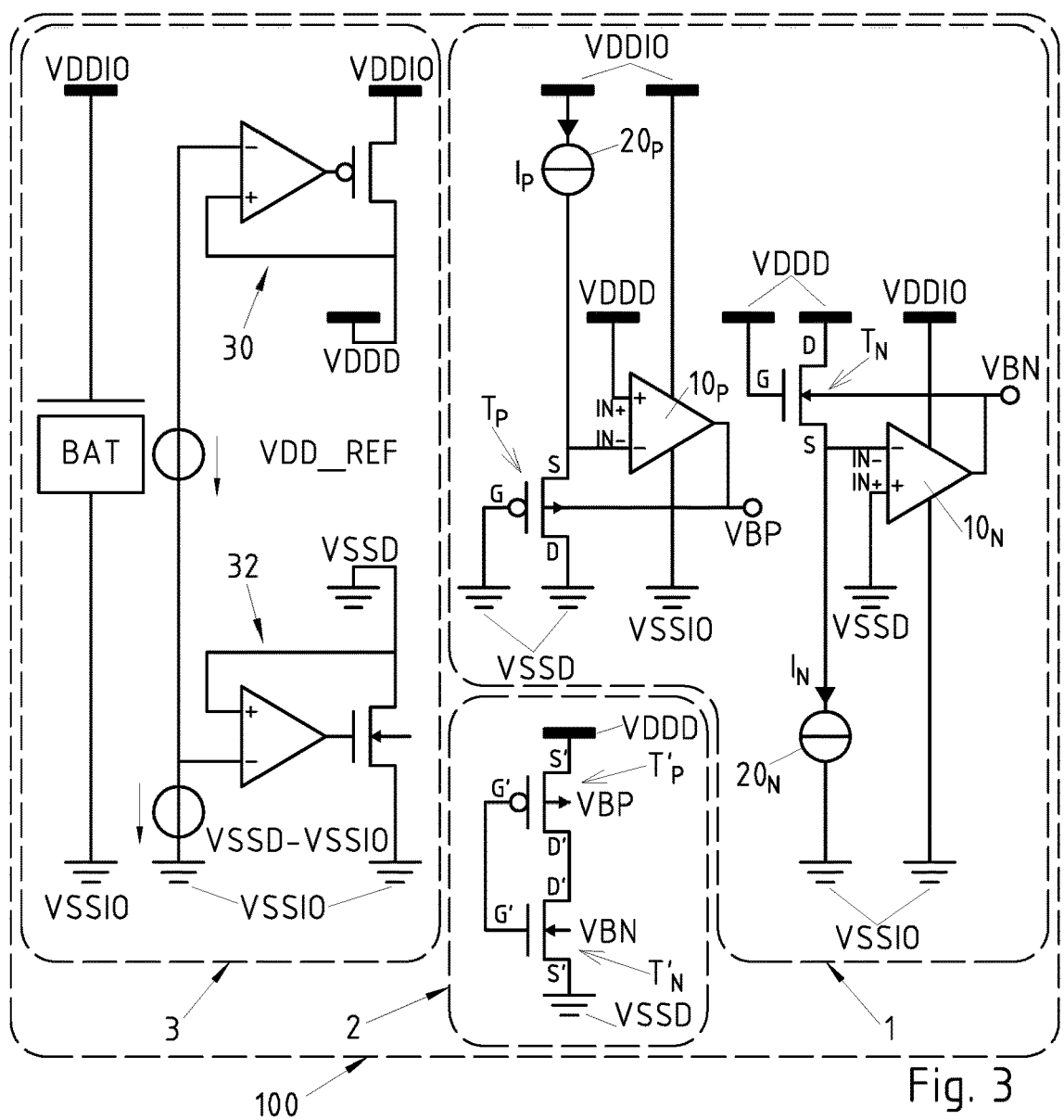
FIG. 3 shows a schematic view of the electronic device according to an embodiment of the invention.

FIG. 3 shows a schematic view of the electronic device 100 according to an embodiment of the invention. In the illustrated embodiment it comprises:

a compensation device 1, for compensating PVT variations of an analog and/or digital circuit 2, the analog and/or digital circuit 2, an input/output circuit 3.

Examples of analog and/or digital circuits 2 to be compensated comprise, but are not limited to, voltage or current references, amplifier, oscillator, memory cells (e.g. SRAM or ROM cells), digital accelerators, processors, etc.

In the illustrated embodiment the input/output circuit 3 comprising a battery BAT, arranged for generating a voltage equal to VDDIO−VSSIO, and means 30, 32 (two LDOs in this case) arranged for generating the voltages of supply source VDDD and of the supply source VSSD of the compensation device 1 and of the analog and/or digital circuit 2. However it must be understood that other means, as DCDC converters, can be used instead of LDOs.

It must be also be understood that the present invention is not limited to the presence of a battery. In fact, instead of comprising a battery, the electronic device according to the invention could comprise a solar cell (e.g. a 0.5 V solar cell) or any other harvesting source, directly generating the difference between the voltages of the first and second supply sources VDDD respectively VSSD.

Moreover, the compensation device according to the invention can also comprise means generating voltages higher and/or lower than the voltages of the first and second supply sources for supplying the current generation module and/or the compensation module, as it will be discussed.

It must be understood that the compensation device according to the invention works by knowing the voltage of only one supply source (VDDD or VSSD).

The compensation device 1 of FIG. 3 comprises a first transistor $T_N$ of N type comprising a first terminal D, a second terminal G, a third terminal S, and a fourth terminal. This fourth terminal allows to modify a threshold voltage $V_{th}$ of the transistor. Then, in one embodiment, the fourth terminal is the bulk terminal B of the transistor. In another embodiment, in particular if the transistor is realised in the technology silicon on insulator (SOI) or fully depleted silicon on insulator (FDSOI), the fourth terminal is the back gate terminal G' of the transistor. In another one embodiment in which the transistor comprises two gate terminals G and G", the fourth terminal is one (G") of the two gate terminals.

In a preferred embodiment, the module of the difference between the voltage of the supply source VSSD and the voltage of the supply source VDDD is comprised between 50 mV and 900 mV, and preferably is substantially equal to 500 mV. Operation at at such low voltages allows to spare dynamic power.

In a preferred embodiment, the transistor $T_N$ is operated to work in a sub-threshold region or in a near-threshold region.

In a preferred embodiment, the transistor $T_N$ is realised in the technology fully depleted silicon on insulator (FDSOI) or in the technology deeply depleted channel (DDC).

According to the invention, the transistor $T_N$ is configured to be in saturation region. In the illustrated embodiment, the transistor $T_N$ is diode configured, as $V_G = V_D$.

However, it must be understood that the present invention is not limited to the diode configuration of the transistor $T_N$: in fact, the second terminal G could be connected to a node of a fixed voltage, for example to a node having a voltage substantially equal to $V_{DDD}/2$, or to the third terminal S.

According to the invention, the voltage at the third terminal S of the transistor $T_N$ has a predetermined value. In the illustrated embodiment, this value is fixed by the virtual ground of the operational amplifier $10_N$: in fact the non-inverting terminal IN+ of the operational amplifier $10_N$ is connected, here directly connected, to the supply source VSSD and the inverting terminal IN of the operational amplifier $10_N$ is connected, here directly connected, to the third terminal S of the transistor $T_N$.

Figure 6:
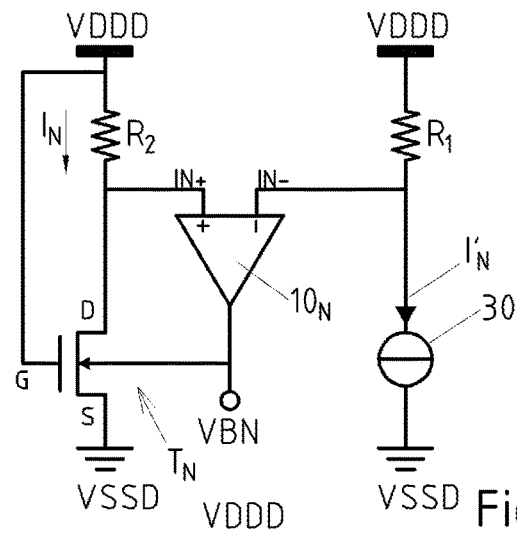
FIG. 6 shows a schematic view of the compensation device according to another embodiment of the invention.
Figure 7:
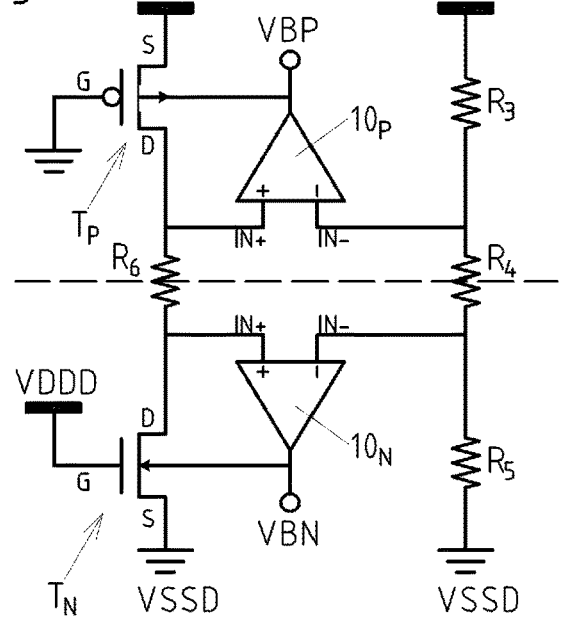
FIG. 7 shows a schematic view of the compensation device according to another embodiment of the invention.
Figure 8:
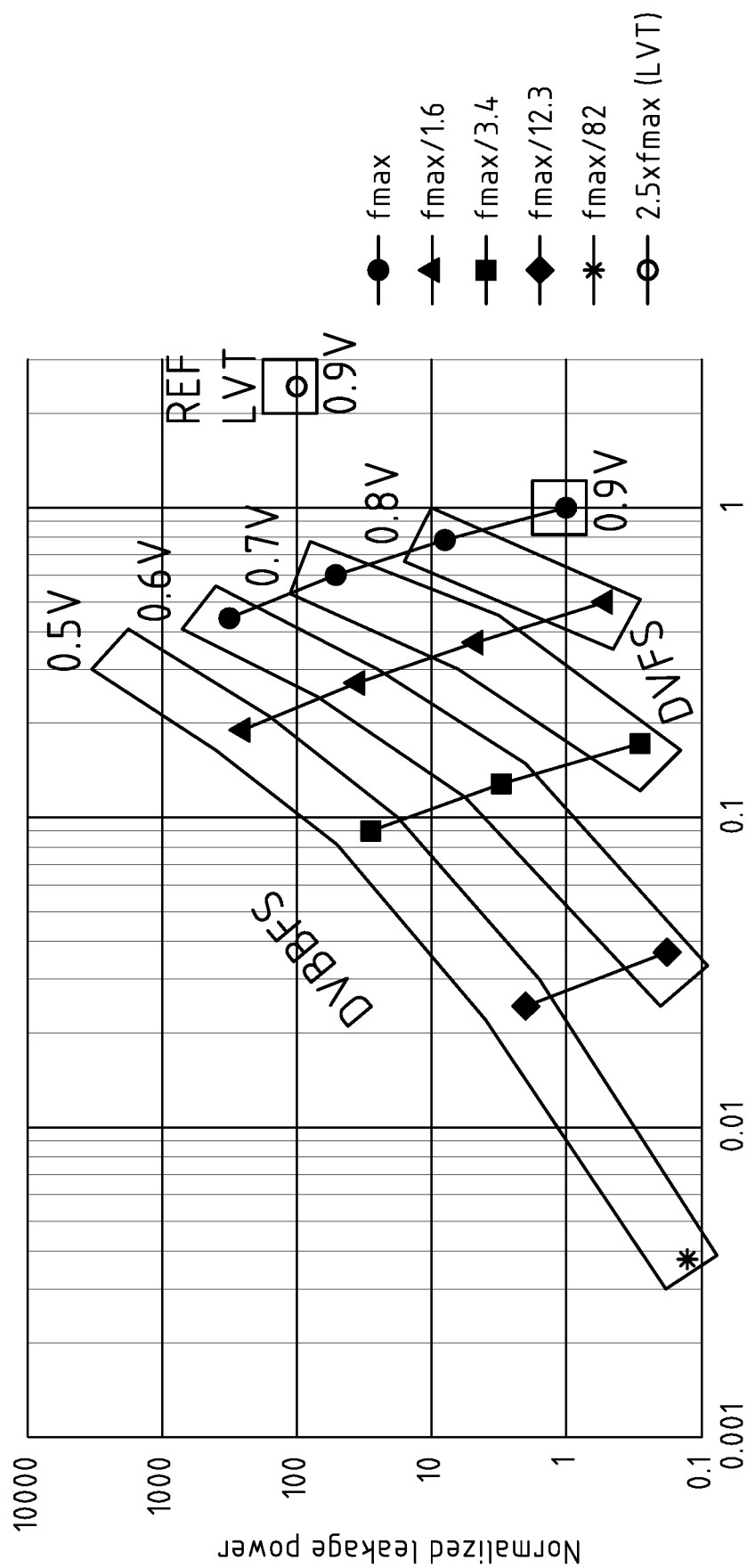
FIG. 8 shows how speed, dynamic and leakage power normalized to the 0.9V ION_min condition evolves over VDD and VBB range. Comparison with the highest speed MOS available in this technology (Low Voltage Technology, LVT) is shown as well.

However, other embodiments allow to impose a given value to the voltage at the third terminal S of the transistor $T_N$: for example in the embodiment of FIGS. 6 to 8, the third terminal S of the first transistor $T_N$ is connected, here directly connected, to a supply source (VSSD).

Moreover, it must be understood that the presence of an operational amplifier is not necessary for indirectly or virtually imposing a given value to the voltage at the third terminal S of the transistor $T_N$:

instead, it could be used any other electronic module comprising at least one input terminal (preferably two input terminals), an output terminal, wherein the output terminal is connected to one input terminal via a close loop with negative feedback, so as to set the voltage difference between the input terminals to a predetermined value, e.g. 0 V or to an offset voltage.

According to the invention, the difference between the voltage at the second terminal G and the voltage at the third terminal S is predetermined. In the present case, this difference is equal to VDDD−VSSD.

A current generation module (the current generator $20_N$ in the illustrated embodiment) is configured to generate a current $I_N$ of a predetermined value.

However, it must be understood that the present invention is not limited to the presence of a current generator, but other means could be used for generating a current $I_N$ of a predetermined value, as will be discussed.

In the illustrated embodiment, the current generation module (i.e. the current generator $20_N$) is connected, here directly connected, to the third terminal S of the transistor $T_N$.

According to the invention, a compensation module is configured to force this current $I_N$ to flow between the first terminal D and the third terminal S of the transistor $T_N$ by adjusting the voltage of the fourth terminal.

In the illustrated embodiment, this compensation module comprises the operational amplifier $10_N$. This operational amplifier $10_N$ comprises an inverting input terminal IN−, a non-inverting input terminal IN+ and an output terminal VBN, wherein:

the inverting input terminal IN− is connected, here directly connected, to the current generation module $20_N$ and to the third terminal S of the transistor $T_N$, the non-inverting input terminal IN+ is connected, here directly connected, to the supply source VSSD, the output terminal VBN is connected, here directly connected, to the fourth terminal, of the transistor $T_N$, and wherein the other supply source VDDD is connected, here directly connected, to the first terminal D of the transistor $T_N$.

However, it must be understood that the compensation module is not limited to comprise an operational amplifier. It could comprise instead a comparator followed by a charge pump module and an integrator. In such a case, if the output of the comparator is higher than zero, charges are injected by the charge pump module to an output node so as raise its voltage, and if the output of the comparator is lower than zero, charges are removed by the charge pump module from this output node so as lower its voltage. This output node is connected to an integrator, e.g. a capacitor, whose output drives the fourth terminal of the transistor.

In all the cases, the compensation module is a module configured to impose the current ($I_N$ in the case of FIG. 3)

through a transistor ($T_N$ in the case of FIG. 3) and to adaptively alter the voltage at the fourth terminal VBN depending on the PVT variations, so as to compensate the PVT variations.

In fact, once the value of the current $I_N$ is imposed or known, the voltage at the fourth terminal VBN for a given supply voltage depends only on some parameters which vary in function of process, temperature and/or voltage variations. By adaptively adjusting of the voltage of the fourth terminal VBN depending on the PVT variations, it is possible to compensate at once all the variations, without monitoring in an individual way each of those parameters.

For example, in one embodiment, the fourth terminal of the transistor is the bulk terminal B. In such a case, its voltage $V_{BB}$ (i.e. the voltage $V_{SB}$ where VS=0V) is determined by the following equation valid in sub-threshold regime:

$$V_{BB} = \frac{1}{n-1}\left(n \cdot U_T \cdot \ln\left\{\frac{I_{ON_{0.5V}}}{IS}\right\} - (V_{DD} + \Delta V_{DD}) + V_{TO} + \Delta V_{T,Proc} + \Delta V_{T,Temp}\right)$$

where n is the body factor of the transistor, $U_T$ is the thermodynamic voltage (about 25 mV)

$I_{ON0.5V}$ is the current $I_N$

IS is the specific current of the transistor $V_{TO}$ is the nominal threshold voltage of the transistor $V_{DD}$ is the gate to source voltage ($V_{GS}$) applied at the transistor that is equal to VDDD-VSSD $\Delta V_{DD}$ is the variation of the voltage $V_{DD}$ $\Delta V_{T,Proc}$ is the variation of the threshold voltage in function of the process $\Delta V_{T,Temp}$ is the variation of the threshold voltage in function of the temperature.

It must be noted that in the above mentioned formula:

n, IS and $\Delta V_{T,Proc}$ vary with the process, $U_T$ and $V_{T,Temp}$ vary with the temperature, and $\Delta V_{DD}$ varies with the supply voltage.

Therefore, once the current $I_N$ and the voltage $V_{DD}$ are defined, variations of all the other parameters in the above-mentioned formula are at once automatically compensated by acting on $V_{BB}$, without the need to monitor them individually.

The output of the compensation module VBN, which is connected to the fourth terminal of the transistor $T_N$, is configured to be connected to the corresponding fourth terminal of a corresponding transistor $T'_N$ of the analog and/or digital circuit 2 to be compensated, the transistor $T'_N$ of the analog and/or digital circuit 2 to be compensated being of the same technology of the transistor $T_N$ of the compensation device 1.

In particular, at a given temporal instant, the difference between the voltage at the second terminal G and the voltage at the third terminal S of the transistor $T_N$ of the compensation device 1 is substantially equal to the difference between the voltage at the second terminal G' and the voltage at the third terminal S' of the transistor $T'_N$ of the analog and/or a digital circuit 2. Moreover, at the same temporal instant, the difference between the voltage VBN at the fourth terminal and the voltage at the third terminal S of the transistor $T_N$ of the compensation device 1 is substantially equal to difference between the voltage VBN at the fourth terminal and the voltage at the third terminal S' of the transistor of the analog and/or a digital circuit 2.

Advantageously, the compensation device 1 according to the invention allows to minimize the supply voltage of the circuit 2 to be compensated, as the voltage headroom present in the known circuits imposed by PVT variations is not more necessary. In fact, according to one embodiment, the analog and/or digital circuit 2 is devoid of voltage headroom.

In the embodiment of FIG. 3, the compensation device 1 comprises also a second transistor $T_P$ of P type, for which the same considerations here above about the first transistor $T_N$ of N type are valid. A second current generation module (in the illustrated case a current generator $20_P$) is configured to generate a current of a given value $I_P$, not necessarily equal to the current $I_N$ generated by the current generator $20_N$. A second compensation module $10_P$ is configured to force the current $I_P$ to flow between the third terminal S and the first terminal D of the second transistor $T_P$ by adjusting the voltage VBP of the fourth terminal of the second transistor $T_P$.

The considerations made here above about the first current generation module are valid for the second current generation module. The considerations made here above about the second compensation module $10_N$ are valid for the second compensation module $10_P$.

The output of the second compensation module VBP, which is connected to the fourth terminal of the second transistor $T_P$, is configured to be connected to the corresponding fourth terminal of a corresponding second transistor $T'_P$ of the analog and/or digital circuit 2 to be compensated, the transistor $T'_P$ of the analog and/or digital circuit 2 to be compensated being of the same technology of the transistor $T_P$ of the compensation device 1. It is therefore possible to control the current—and hence speed or delay of a digital circuit to be compensated—of both type of transistors N and P independently, by adjusting their threshold voltage through their fourth terminals.

In the embodiment illustrated in FIG. 3, the excursion of the VBN, VBP voltages spans across their respective supply voltages VSSD, VDDD. In a preferred embodiment, for VDDD−VSSD=0.5 V, the excursion of the VBN, VBP voltages is purposely limited to the range of [VSSD−1 V; VSSD+0.6 V] and [VDDD−0.6V; VDDD+1V] for each transistor type respectively the value of −1 V depending on technological limits and the value 0.6 V depending on forward diode limits. As such, a minimum VDDIO-VSSIO battery supply voltage of 2.5 V is desired, leaving 2×1 V reverse bias excursion on top of the 0.5V VDDD-VSSD core supply voltage (about 0.5 V in the example).

In a preferred embodiment, it is advantageous to regulate the levels of VDDD and VSSD so tha.

(VDDIO+VSSIO)/2=(VDDD+VSSD)/2

In another embodiment, both VSSIO and VSSD may be referenced to the same ground level VSS, necessitating in addition the generation of a negative voltage VNEG<VSS to supply the current generators $20_N$ and/or $20_P$ and/or the operational amplifiers 10N and/or 10P.

As indicated in FIG. 3, the current generators $20_N$ and $20_P$ and/or the operational amplifiers 10N and 10P can be supplied by a voltage higher than the voltage of the supply source VDDD and/or by a voltage lower than the voltage of the supply source VSSD.

In must be noted that, in the embodiment in which the compensation module comprises, instead of an operational amplifier, a comparator followed by a charge pump module and an integrator, it is not required that its supply be higher than the voltage of the supply source VDDD and/or lower than the voltage of the supply source VSSD.

If the compensation device according to the invention is used for compensating an analog circuit, it can comprise a module configured for generating a voltage allowing an analog signal to have at least in some nodes a sufficient voltage range in which it can oscillate. This module can comprise:
- a voltage generator in series with the transistor of the compensation device, and placed between the first supply source and the second supply source, and/or
- means for modifying the value of the two supply sources VSSD, VDDD, so as to allow the above-mentioned range, and/or
- means for generating and/or modifying an offset of the compensation module.

In one embodiment (not illustrated), the electronic device 1 according to the invention comprises two or more compensation devices according to the invention, and the analog and/or a digital circuit comprises at least one switch arranged to connect the fourth terminal of the transistor of the analog and/or digital circuit 2 to one of the two or more output terminals of the compensation modules.

Figure 4:
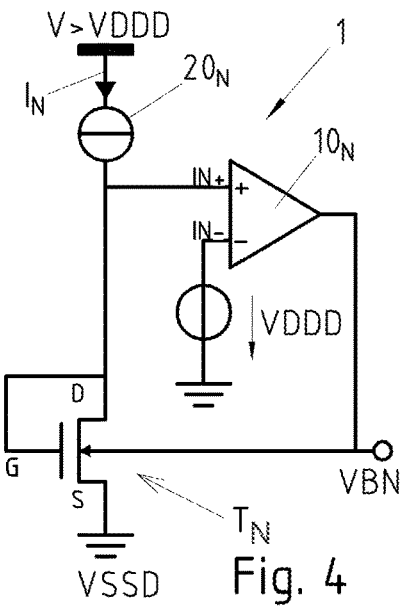
FIG. 4 shows a schematic view of the compensation device according to another embodiment of the invention.

FIG. 4 illustrates another embodiment of the compensation device 1 according to the invention, comprising a transistor $T_N$ of N type. In this case, the compensation module comprises an operational amplifier $10_N$ wherein:
- its non-inverting input terminal IN+ is connected to a current generation module (the current source $20_N$) and to a first terminal D of the transistor,
- its inverting input terminal IN− is connected to the supply source VDDD,
- its output terminal VBN is connected to the fourth terminal, and
- the supply source VSSD is connected to the third terminal S of the transistor.

In the embodiment illustrated in FIG. 4, the current generation module (the current source $20_N$) should be supplied by a voltage V>VDDD if it is desired that the voltage at the second terminal of the transistor $T_N$ be equal to VDDD. Alternatively, an offset voltage greater than 100 mV may purposely be introduced in the operational amplifier so as to guarantee the saturation of the current generation module (the current source $20_N$) even if it is supplied at a voltage V=VDDD. Such an embodiment could typically be used when compensating an analog circuit.

It must be understood that a configuration similar to that illustrated in FIG. 4 can be applied to a compensation device 1 comprising a transistor of P type.

Figure 5:
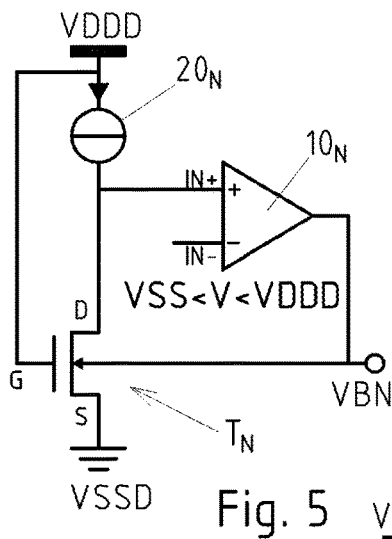
FIG. 5 shows a schematic view of the compensation device according to another embodiment of the invention.

FIG. 5 illustrates another embodiment of the compensation device 1 according to the invention, comprising a transistor $T_N$ of N type. In this case the compensation module comprises an operational amplifier $10_N$ wherein:
- its non-inverting input terminal IN+ is connected to a current generation module (the current sources $20_N$) and to a first terminal D of the transistor,
- its inverting input terminal IN− is not connected to the supply source VDDD as in FIG. 4, but to a voltage which guaranties the saturation of both the current generation module and the transistor $T_N$ (e.g. VDD/2),
- its output terminal VBN is connected to the fourth terminal, and
- the supply source VSSD is connected to the third terminal S of the transistor.

Therefore, in the embodiment illustrated in FIG. 5, it is not necessary to supply the current generation module (the current sources $20_N$) by a voltage V>VDDD in the absence of an offset voltage in the operational amplifier.

FIG. 6 illustrates another embodiment of the compensation device 1 according to the invention. In this embodiment, there is not a current generator directly connected to the transistor. In this embodiment, a current generator 30, generating the current $I'_N$ is in series with a resistor of known value $R_1$. As this series arrangement is placed between VSSD and VDDD, the voltage value of the inverting input terminal IN− of the operational amplifier $10_N$ is known. Thanks to the virtual ground of the operational amplifier $10_N$, the voltage value of the non-inverting input terminal IN+ of the operational amplifier $10_N$ is also known. By knowing the value of the resistor $R_2$ placed between VDDD and the non-inverting input terminal IN+ of the operational amplifier $10_N$, the current IN imposed to the transistor $T_N$ is known, and related to the value of the current generator 30 depending on the values of $R_1$ and $R_2$.

Therefore, the current generation module of the compensation device according to the invention could comprise a current source connected, preferably directly connected, to the first terminal D or to the third terminal S of the transistor, or (as illustrated in FIG. 6), a resistor connected to the first terminal D or to the third terminal S of the transistor and placed between two nodes of known voltages, the current flowing in the transistor being related to another known current (e.g. the current of the current generator 30).

Advantageously, this resistor can be implemented either by a physical resistance as illustrated in FIG. 6, or a switch cap circuit or an appropriately biased transistor.

FIG. 7 illustrates another embodiment of the compensation device 1 according to the invention in which there is a single current generation module shared by the transistor $T_N$ of N type and by the transistor $T_P$ of P type. The current generation module in the present embodiment comprises the resistor $R_6$ of known value, which is placed between two nodes of known voltages (i.e. the two non-inverting input terminals IN+ of the operational amplifiers $10_P$ and $10_N$). In fact, thanks to the virtual ground of the operational amplifiers $10_P$ and $10_N$, the voltages at their non-inverting input terminals IN+ correspond to the voltages at their inverting input terminals IN−, which is known as determined by the voltage divider comprising the resistors of known values $R_3$, $R_4$ and $R_5$, placed between VDDD and VSSD.

In the embodiment of FIG. 7, the current of given or known value flowing through the transistors $T_N$ and $T_P$ is a function of the difference between the two supply sources VDDD and VSSD. This embodiment allows to better control the frequency f of a digital circuit to be compensated if one of the two supply voltages varies, as f=I/(CV)=1/(RC).

The dotted line in FIG. 7 indicates that it is possible to split each of the resistors $R_4$ and $R_6$ in two parts, so as that the compensation device comprising the transistor of N type $T_N$ is completely symmetric with regard to the compensation device comprising the transistor of P type $T_P$.

It must also be noted that in the case of FIG. 7, the compensation device comprising the transistor of N type $T_N$ is connected to the compensation device comprising the transistor of P type $T_P$. Therefore, this embodiment is more compact than the embodiment shown in FIG. 3 for example.

According to another embodiment, the current generation module is a variable current generation module, generating a current of a given value that can be selected by a user among different values.

In one preferred embodiment, a current DAC can be used to generate a programmable current that can be used to bias the transistor of the compensation device 1. As an input, it will require a reference current. A PTAT current reference will provide a current that is temperature (T) and resistor (R) value dependent (I proportional to T/R). Alternatively, the unwanted temperature dependency can be eliminated if the resistor is replaced by a MOS transistor operating in the triode region using the specific current generation circuit well-known from those skilled in the art.

According to another embodiment (not illustrated), the compensation device according to the invention comprises an oscillator (e.g. XTAL oscillator of frequency $f_{XO}$) and a switched cap circuit clocked by this oscillator and whose voltage reference is related to the first and second supply voltages VSSD and VDDD so that their ratio remains constant, and a capacitor $C_I$ that matches a capacitor of the circuit 2 to be compensated, so as to compensate the capacitance variation of this capacitor.

In one preferred embodiment, the capacitance of the capacitor $C_I$ is formed using a placed and routed (P&R) combination of cells to match the logic design conditions.

In other words, defining the switching voltage $(V_I)$ as a fraction of the core logic supply voltage (VDDD) e.g. using a bandgap reference for both, will lead to the following relationship:

$$f_{DIG} = K \cdot f_{XO} \cdot (C_I \cdot V_I)/(C_{DIG} \cdot V_{DDD})$$

where K is the current DAC gain, the parameter that can be adapted to take into account designs with different logic depth. All other terms are ratios of identical physical parameters and their variations will hence cancel out. As a result, the delay of the digital cells is locked to the frequency of the oscillator.

Although FIGS. 3 to 7 show a compensation circuit comprising at most two transistors (one of N type and one of P type), it must be understood that the invention is not limited to such a number. In practical realisations, the number of transistors can be higher (e.g. 30 or 40 transistors) and transistors of the same type (N or P) can be placed in series and/or in parallel for better averaging their process variations.

FIG. 8 shows how speed, dynamic and leakage power normalized to the 0.9V ION_min condition evolves over VDD and VBB range. Comparison with the highest speed MOS available in this technology (Low Voltage Technology, LVT) is shown as well.

Lines with dots correspond to operation at a given frequency fmax at different supply voltages, illustrating the dynamic and leakage power trade-off. Rectangles regroup the range of frequencies achievable at a given supply voltage as ION is swept over the corresponding allowed range.

For leakage critical applications as e.g. in memory, where the ratio of idle to active cells is very high, the FIG. 8 shows that it is best to raise the supply voltage to reach the wanted speed rather than lowering the transistor Vth by tuning the fourth terminal. This is the conventional dynamic voltage frequency scaling technique (DVFS).

When leakage does not dominate the dynamic power, as e.g. in digital accelerators or processors where the average rate of transitions per gate is much higher, increasing the speed while maintaining a low supply voltage yields significant dynamic power savings at the cost however of a much faster leakage increase (×60 in speed results in ×2000 in leakage at 0.5V). This is the new scheme proposed by the invention, which in FIG. 8 is called DVBBFS, where BB stands for body bias.

Therefore, the compensation circuit according to the invention permit to achieve the best dynamic and leakage power trade-off depending on the type of design (very different requirements in a memory or in a processor/accelerator).

It ensures a good control of ION/IOFF current ratios, hence a robust retention at low voltage (e.g. in a SRAM).

It permits the retention at low leakage in SRAM cell by minimizing the ION current.

It permits to tunes the speed and leakage dynamically (e.g. low leakage in idle mode, higher leakage in high speed mode, thereby eliminating the necessity of power gating and the use of retention flip-flop.

What is claimed is:

1. A compensation device for compensating process, voltage, and/or temperature variations of a digital circuit, said compensation device comprising:
    a transistor, said transistor comprising
        a first terminal,
        a second terminal,
        a third terminal, and
        a fourth terminal, said fourth terminal allowing to modify a threshold voltage of the transistor,
        wherein the transistor is configured to be in saturation region,
        wherein the voltage at the third terminal has a predetermined value,
        wherein the difference between the voltage at the second terminal and the voltage at the third terminal has a predetermined value,
    a current generation module, configured to generate a current of a predetermined value,
    a compensation module, having an input connected to the first terminal or to the third terminal and an output connected to the fourth terminal and configured to force said current to flow between said first terminal and said third terminal by adjusting the voltage of said fourth terminal,
        wherein the current generation module is a variable current generation module, generating a current of a given value that can be selected by a user among different values,
        wherein the compensation module is configured such that a speed of the digital circuit is proportionally linked to the current of the current generation module, so that the speed of the digital circuit is adjusted by the user by selecting the value of the current of the current generation module, wherein said current selected by the user is forced by the compensation module to flow between said first terminal and said third terminal by adjusting the output voltage of the compensation module,
        wherein the compensation device is configured such that during the adjustment of the speed of the digital circuit by the user, a voltage supply of the compensation device and of the digital circuit is kept constant.

2. The compensation device of claim 1, said fourth terminal being the bulk terminal of the transistor, or the back gate terminal of the transistor, or if the transistor comprises two gate terminals a second gate terminal of the transistor.

3. The compensation device of claim 1, comprising a first supply source, and a second supply source different from the first supply source.

4. The compensation device of claim 3, the compensation module comprising an operational amplifier comprising an inverting input terminal, a non-inverting input terminal and an output terminal, wherein:

the inverting input terminal is connected to the current generation module and to the third terminal of the transistor, the non-inverting input terminal is connected to the first supply source, the output terminal is connected to the fourth terminal, and wherein the second supply source is connected to the first terminal of said transistor.

5. The compensation device of claim 3, the compensation module comprising an operational amplifier comprising an inverting input terminal, a non-inverting input terminal and an output terminal, wherein:

the non-inverting input terminal is connected to the current generation module and to the first terminal of the transistor, the inverting input terminal is connected to the second supply source, or to a voltage guarantying the saturation of the transistor, the output terminal is connected to the fourth terminal, and wherein the first supply source is connected to the third terminal of said transistor.

6. The compensation device of claim 3, wherein the difference between the voltage of first supply source and the voltage of second supply source is between 50 mV and 900 mV.

7. The compensation device of claim 6, wherein the difference between the voltage of first supply source and the voltage of second supply source is substantially equal to 500 mV.

8. The compensation device of claim 3, comprising a battery and means for generating the voltages of said first and second supply sources from said battery, at least one LDO and/or at least one DCDC converter, and comprising means generating voltages higher and/or lower than the voltages of said first and second supply sources for supplying the current generation module and/or the compensation module.

9. The compensation device of claim 1, the current of given or known value generated by the current source module being a function of at least one supply source, or a function of the difference between the first supply source and the second supply source.

10. The compensation device of claim 1, the second terminal of said transistor being connected to:
said first terminal, or
a node of a fixed voltage.

11. The compensation device of claim 1, the current generation module comprising
a current source connected to the first terminal or to the third terminal of the transistor, or
a resistor, connected to the first terminal or to the third terminal of the transistor and placed between two nodes of known voltages, the current flowing in said transistor being related to another current.

12. The compensation device of claim 11, said resistor being implemented either by a physical resistance, a switched capacitance circuit or a biased transistor.

13. The compensation device of claim 1, wherein the transistor is operated to work in a sub-threshold region or in a near-threshold region.

14. The compensation device of claim 1, at least one transistor being realised in the technology fully depleted silicon on insulator or in the technology deeply depleted channel.

15. The compensation device of claim 1, said transistor being a first transistor of a N or P type, said current generation module being a first current generation module, said compensation module being a first compensation module, said device further comprising a second transistor of P respectively N type, said second transistor comprising
a first terminal,
a second terminal,
a third terminal, and
a fourth terminal, said fourth terminal allowing to modify a threshold voltage of the second transistor,
wherein said second transistor is configured to be in saturation region,
wherein the voltage at the third terminal of the second transistor has a predetermined value and the difference between the voltage at the second terminal and the voltage at the third terminal of the second transistor has a predetermined value,
a second current generation module configured to generate a current of a given value, not necessarily equal to the current generated by the first current generation module,
a second compensation module configured to force the current generated by the second current generation module to flow between said first terminal and said third terminal of the second transistor by adjusting the voltage of the fourth terminal of the second transistor.

16. An electronic device comprising:
at least one compensation device of claim 1,
an analog and/or a digital circuit comprising at least one transistor,
means for connecting an output terminal of the compensation module to the fourth terminal of the transistor of said analog and/or digital circuit,
wherein
at a given temporal instant, the difference between the voltage at the second terminal and the voltage at the third terminal of the transistor of the compensation device is substantially equal to a difference between the voltage at the second terminal and the voltage at the third terminal of the transistor of the analog and/or a digital circuit,
wherein
at the same temporal instant, the difference between the voltage at the fourth terminal and the voltage at the third terminal of the transistor of the compensation device is substantially equal to a difference between the voltage at the fourth terminal and the voltage at the third terminal of the transistor of the analog and/or a digital circuit,
and wherein
the transistor of the compensation device is of the same technology of the transistor of said analog and/or digital circuit.

17. The electronic device of claim 16, said analog and/or digital circuit being devoid of voltage headroom.

18. An electronic device, comprising two or more compensation devices of claim 1, an analog and/or a digital circuit comprising at least one transistor, the analog and/or a digital circuit comprising at least one switch arranged to connect the fourth terminal of the transistor of said analog and/or digital circuit to one of the two or more output terminals of the compensation modules, means for connecting an output terminal of the compensation module to the fourth terminal of the transistor of said analog and/or digital circuit,wherein at a given temporal instant, the difference between the voltage at the second terminal and the voltage at the third terminal of the transistor of the compensation device is substantially equal to difference between the voltage at the second terminal and the voltage at the third terminal of the transistor of the analog and/or a digital circuit, wherein at the same temporal instant, the difference between the voltage at the fourth terminal and the voltage at the third terminal of the transistor of the compensation device is substantially equal to difference between the voltage at the fourth terminal and the voltage at the third terminal of the transistor of the analog and/or a digital circuit, and wherein the transistor of the compensation device is of the same technology of the transistor of said analog and/or digital circuit.

19. The electronic device of the claim 18, comprising a compensation device, said transistor being a first transistor of a N or P type, said current generation module being a first current generation module, said compensation module being a first compensation module, said device further comprising
a second transistor of P respectively N type, said second transistor comprising
a first terminal,
a second terminal,
a third terminal, and
a fourth terminal, said fourth terminal allowing to modify a threshold voltage of the second transistor,
wherein said second transistor is configured to be in saturation region,
wherein the voltage at the third terminal of the second transistor has a predetermined value and the difference between the voltage at the second terminal and the voltage at the third terminal of the second transistor has a predetermined value,
a second current generation module configured to generate a current of a given value, not necessarily equal to the current generated by the first current generation module,
a second compensation module configured to force the current generated by the second current generation module to flow between said first terminal and said third terminal of the second transistor by adjusting the voltage of the fourth terminal of the second transistor,
wherein the at least one transistor of said analog and/or digital circuit being a first transistor of a N or P type, said analog and/or digital circuit comprising a second transistor of P respectively N type, said electronic device further comprising means for connecting the output terminal of the second compensation module to the fourth terminal of the second transistor of said analog and/or digital circuit.

20. The compensation device of claim 1, wherein the current generation module comprises a current digital analog converter (DAC) for generating a programmable current for biasing said transistor, said current DAC having a reference current as an input.

21. The compensation device of claim 1, wherein the compensation device is configured such that the speed of the digital circuit is adjusted by the user solely by selecting the value of the current of the current generation module.

22. The compensation device of claim 1, wherein the fourth terminal of the transistor is the bulk terminal, wherein said second terminal is the gate terminal, wherein said transistor is in sub-threshold regime, wherein:

$$V_{BB} = \frac{1}{n-1}\left(n \cdot U_T \cdot \ln\left\{\frac{I_{ON_{0.5V}}}{IS}\right\} - (V_{DD} + \Delta V_{DD}) + V_{TO} + \Delta V_{T,Proc} + \Delta V_{T,Temp}\right)$$

where
$V_{BB}$ is a difference between the voltage of the bulk terminal and the voltage at a source terminal,
n is a body factor of the transistor,
$U_T$ is a thermodynamic voltage,
$I_{ON0.5V}$ is a current generated by the current source module,
Is is a specific current of the transistor,
VTO is a nominal threshold voltage of the transistor,
VDD is a difference between the gate voltage and a voltage at the first or third terminal of the transistor, said difference being equal to a difference between a first supply source voltage and a second supply source voltage,
$\Delta$VDD is a variation of the voltage VDD,
$\Delta V_{T, Proc}$ is a variation of the threshold voltage in a function of a process, and
$\Delta V_{T, Temp}$ is a variation of the threshold voltage in a function of a temperature.

23. A compensation device for compensating process, voltage, and/or temperature variations of a digital circuit, said compensation device comprising:
a transistor, said transistor comprising
a first terminal,
a second terminal,
a third terminal, and
a fourth terminal, said fourth terminal allowing to modify a threshold voltage of the transistor,
wherein the transistor is configured to be in saturation region,
wherein the voltage at the third terminal has a predetermined value,
wherein the difference between the voltage at the second terminal and the voltage at the third terminal has a predetermined value,
a current generation module, configured to generate a current of a predetermined value,
a compensation module, configured to force this current to flow between said first terminal and said third terminal by adjusting the voltage of said fourth terminal,
a first supply source, and a second supply source different from the first supply source, and
a solar cell or an harvesting source, the solar cell or the harvesting source directly generating the difference between the voltages of the first and second supply sources, and comprising means for generating voltages higher and/or lower than the voltages of said first and second supply sources for supplying the current generation module and/or the compensation module.

24. An electronic device comprising:
at least one compensation device for compensating process, voltage, and/or temperature variations of an analog and/or digital circuit, said compensation device comprising:
a transistor, said transistor comprising
a first terminal,
a second terminal,
a third terminal, and
a fourth terminal, said fourth terminal allowing to modify a threshold voltage of the transistor, wherein the transistor is configured to be in saturation region, wherein the voltage at the third terminal has a predetermined value, wherein the difference between the voltage at the second terminal and the voltage at the third terminal has a predetermined value, a current generation module, configured to generate a current of a predetermined value, a compensation module, configured to force this current to flow between said first terminal and said third terminal by adjusting the voltage of said fourth terminal, wherein the current generation module is a variable current generation module, generating a current of a given value that can be selected by a user among different values, wherein the digital circuit is configured such that the speed of the digital circuit is proportionally linked to said current, so that the speed of the digital circuit is adjusted by the user by selecting the value of the current of the current generation module, wherein the compensation device is configured such that during the adjustment of the speed of the digital circuit by the user, a voltage supply of the compensation device is kept constant, the analog and/or digital circuit comprising at least one transistor, means for connecting an output terminal of the compensation module to the fourth terminal of the transistor of said analog and/or digital circuit, wherein at a given temporal instant, the difference between the voltage at the second terminal and the voltage at the third terminal of the transistor of the compensation device is substantially equal to a difference between the voltage at the second terminal and the voltage at the third terminal of the transistor of the analog and/or a digital circuit, wherein at the same temporal instant, the difference between the voltage at the fourth terminal and the voltage at the third terminal of the transistor of the compensation device is substantially equal to a difference between the voltage at the fourth terminal and the voltage at the third terminal of the transistor of the analog and/or a digital circuit, and wherein the transistor of the compensation device is of the same technology of the transistor of said analog and/or digital circuit, comprising an oscillator and a switched capacitance circuit clocked by said oscillator and whose voltage reference is related to the first and second supply voltages so that their ratio remains constant, and comprising a capacitor that matches a capacitor of said digital circuit, so as to compensate the capacitance variation of said capacitor of said digital circuit.

* * * * *